(12) United States Patent
Cai et al.

(10) Patent No.: US 12,175,043 B2
(45) Date of Patent: Dec. 24, 2024

(54) TOUCH SUBSTRATE, DISPLAY APPARATUS AND DISPLAY SYSTEM

(71) Applicants: Beijing BOE Sensor Technology Co., Ltd., Beijing (CN); BOE Technology Group Co., Ltd., Beijing (CN)

(72) Inventors: Shoujin Cai, Beijing (CN); Cheng Li, Beijing (CN); Chuncheng Che, Beijing (CN); Feng Liu, Beijing (CN); Tiansheng Li, Beijing (CN); Lin Zhou, Beijing (CN); Kunjing Chung, Beijing (CN); Dexi Kong, Beijing (CN); Yingzi Wang, Beijing (CN)

(73) Assignees: Beijing BOE Sensor Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/565,136

(22) PCT Filed: Jun. 3, 2021

(86) PCT No.: PCT/CN2021/098196
§ 371 (c)(1),
(2) Date: Nov. 29, 2023

(87) PCT Pub. No.: WO2022/252194
PCT Pub. Date: Dec. 8, 2022

(65) Prior Publication Data
US 2024/0201814 A1  Jun. 20, 2024

(51) Int. Cl.
*G06F 3/042* (2006.01)
*G02F 1/1333* (2006.01)
(Continued)

(52) U.S. Cl.
CPC ........ *G06F 3/0421* (2013.01); *G02F 1/13338* (2013.01); *G02F 1/133512* (2013.01); *H01L 31/03762* (2013.01)

(58) Field of Classification Search
None
See application file for complete search history.

(56) References Cited

U.S. PATENT DOCUMENTS

2016/0295143 A1* 10/2016 Park ........................ H04N 25/75

FOREIGN PATENT DOCUMENTS

| CN | 101325207 A | 12/2008 |
|---|---|---|
| CN | 101452136 A | 6/2009 |

(Continued)

*Primary Examiner* — Christopher J Kohlman
(74) *Attorney, Agent, or Firm* — HOUTTEMAN LAW LLC

(57) ABSTRACT

A touch substrate, a display apparatus and a display system are provided. The touch substrate includes a base substrate including a photosensitive region; a plurality of photosensitive pixels in an array in the photosensitive region, each photosensitive pixel includes one non-visible light sensor, and a ratio of a side length of each photosensitive pixel to a distance between the non-visible light sensors of two adjacent photosensitive pixels is in a range from 25:24 to 12:11; and a plurality of bias lines on a side of the plurality of non-visible light sensors away from the base substrate, the plurality of bias lines include a plurality of first bias lines and a plurality of second bias lines crossing with each other, and at least one of the plurality of first bias lines and the plurality of second bias lines is electrically connected to each non-visible light sensor.

20 Claims, 10 Drawing Sheets

(51) Int. Cl.
   *G02F 1/1335*   (2006.01)
   *H01L 31/0376*  (2006.01)

(56) References Cited

FOREIGN PATENT DOCUMENTS

| | | |
|---|---|---|
| CN | 101900899 A | 12/2010 |
| CN | 102447851 A | 5/2012 |
| CN | 105718118 A | 6/2016 |
| CN | 106201071 A | 12/2016 |
| CN | 107329620 A | 11/2017 |
| CN | 107505753 A | 12/2017 |
| CN | 107689384 A | 2/2018 |
| CN | 109872689 A | 6/2019 |
| CN | 110825269 A | 2/2020 |
| EP | 2898399 B1 | 11/2019 |
| WO | WO 9921160 A1 | 4/1999 |

* cited by examiner

TOUCH SUBSTRATE, DISPLAY APPARATUS AND DISPLAY SYSTEM

TECHNICAL FIELD

The present disclosure relates to the field of display technology, and in particular to a touch substrate, a display apparatus and a display system.

BACKGROUND

With the continuous development of communication technology, computer technology and electronic technology, mobile communication is developing from Human to Human (H2H) communication to Human to Machine (H2M) communication and Machine to Machine (M2M) communication, and the Internet of Everything becomes a necessary trend for the development of the mobile communication.

The Internet of Things (IoT) has been emerged in this context, and is considered to be the third wave of the world information industry after the computer and the Internet. The Internet of Things adopts the means of the informatization technology to promote the comprehensive upgrade of human life and production service, and has a wide application and development prospect and a strong industrial driving capability. European and American countries have brought development of the Internet of Things into the whole informatization strategy, and China has also definitely brought the development of the Internet of Things into the Outline of the National Medium and Long Term Science and Technology Development Program (2006-2020) and the 2050 National Industry Roadmap of China.

In the general background of the Internet of Things, the human-computer interaction appears to be particularly important, and the human-computer interaction is not only the infrastructure of the Internet of Things, but also the final target of the Internet of Things, for achieving the Internet of Everything serving human beings. The human-computer interaction refers to the fact that a user communicates with and operates a system through a human-computer interaction interface. A small object, such as a play button of a radio, and a big object, such as a dashboard on a plane or a control room of a power plant, are both used at every moment. There are various ways for implementing the human-computer interaction, such as a touch control based on a pressure, a resistance or a capacitance, or a face recognition based on the light, or a sound-based ultrasound, or a tactile feedback based on an electrostatic feedback or the like. The touch interaction of the consumer products, such as mobile phones and televisions, is widely applied at present, but the technology has a certain limitation. That is, the interaction can be realized only by a contact-type touch control, which limits the range of application and cannot realize the remote touch interaction. A light touch control has been emerged in this context.

SUMMARY

Embodiments of the present disclosure provide a touch substrate, a display apparatus and a display system as below.

In one aspect, embodiments of the present disclosure provide a touch substrate, including: a base substrate including a photosensitive region; a plurality of photosensitive pixels in an array in the photosensitive region, each photosensitive pixel includes one non-visible light sensor, and a ratio of a side length of each photosensitive pixel to a distance between the non-visible light sensors of two adjacent photosensitive pixels is in a range from 25:24 to 12:11; and a plurality of bias lines on a side of non-visible light sensors away from the base substrate, the plurality of bias lines include a plurality of first bias lines and a plurality of second bias lines crossing with each other, and at least one of the plurality of first bias lines and the plurality of second bias lines is electrically connected to each non-visible light sensor.

Optionally, in the touch substrate provided by the embodiments of the present disclosure, each first bias line is electrically connected to one row of non-visible light sensors, and each second bias line is electrically connected to one column of non-visible light sensors.

Optionally, in the touch substrate provided by the embodiments of the present disclosure, the base substrate further includes a non-photosensitive region around the photosensitive region; and the touch substrate further includes: a closed-loop trace in the non-photosensitive region and electrically connected to at least a part of the plurality of bias lines, and a line width of the closed-loop trace is greater than that of each bias line.

Optionally, in the touch substrate provided by the embodiments of the present disclosure, the line width of each bias line is in a range from 8 μm to 15 μm, and the line width of the closed-loop trace is in a range from 200 μm to 500 μm.

Optionally, in the touch substrate provided by the embodiments of the present disclosure, the closed-loop trace and the plurality of bias lines are in a same layer and made of a same material.

Optionally, in the touch substrate provided by the embodiments of the present disclosure, the plurality of bias lines are made of a metal element or an alloy.

Optionally, in the touch substrate provided by the embodiments of the present disclosure, each photosensitive pixel has a side length in a range from 3 mm to 5 mm.

Optionally, in the touch substrate provided by the embodiments of the present disclosure, the touch substrate further includes: a non-visible light antireflection film on a side of the non-visible light sensors away from the base substrate, and completely covering the photosensitive region.

Optionally, in the touch substrate provided by the embodiments of the present disclosure, the non-visible light antireflection film is made of a black matrix material, and the black matrix material selectively transmits non-visible light.

Optionally, in the touch substrate provided by the embodiments of the present disclosure, the touch substrate further includes: a plurality of gate lines and a plurality of data lines; an extending direction of each gate line is identical to that of each first bias line, and an extending direction of each data line is identical to that of each second bias line; an orthographic projection of the plurality of gate lines on the base substrate and an orthographic projection of the plurality of first bias lines on the base substrate do not overlap with each other or at least partially overlap with each other; and an orthographic projection of the plurality of data lines on the base substrate and an orthographic projection of the plurality of second bias lines on the base substrate do not overlap with each other or at least partially overlap with each other.

Optionally, in the touch substrate provided by the embodiments of the present disclosure, each non-visible light sensor includes a first electrode, a photosensitive layer, and a second electrode which are stacked, the first electrode is between the base substrate and the photosensitive layer and in a direct contact with the photosensitive layer; the second electrode is electrically connected to the corresponding first bias line and the corresponding second bias line and in a direct contact with the photosensitive layer.

Optionally, in the touch substrate provided by the embodiments of the present disclosure, the photosensitive layer includes a P-type amorphous silicon semiconductor layer, an intrinsic amorphous silicon semiconductor layer, and an N-type amorphous silicon semiconductor layer which are stacked sequentially, the P-type amorphous silicon semiconductor layer is in a direct contact with the second electrode, and the N-type amorphous silicon semiconductor layer is in a direct contact with the first electrode.

Optionally, in the touch substrate provided by the embodiments of the present disclosure, a ratio of an area of the photosensitive layer of each non-visible light sensor to an area of each photosensitive pixel is in a range from 0.0004 to 0.0036.

Optionally, in the touch substrate provided by the embodiments of the present disclosure, each photosensitive pixel further includes a transistor, a gate electrode of the transistor is electrically connected to a corresponding gate line, a first electrode of the transistor is electrically connected to a corresponding data line, and a second electrode of the transistor is electrically connected to a corresponding first electrode; and the gate electrode of the transistor is made of a same material as the gate line and is located in a same layer as the gate line; the data line, the first electrode and the second electrode of the transistor are made of a same material and arranged in a same layer; and the data line is between a layer where the gate line is located and a layer where the first electrode is located.

Optionally, in the touch substrate provided by the embodiments of the present disclosure, an orthographic projection of a channel region of the transistor on the base substrate is within an orthographic projection of a corresponding second bias line on the base substrate.

In another aspect, embodiments of the present disclosure further provide a display apparatus, including a display module and a touch substrate, the touch substrate is the touch substrate provided by the embodiments of the present disclosure, and the touch substrate is on a side of the display module away from a display surface of the display module.

Optionally, in the display apparatus provided in the embodiments of the present disclosure, the display module is a liquid crystal display module.

Optionally, in the display apparatus provided in the embodiments of the present disclosure, the display apparatus further includes a backlight module; the display module is arranged on a light outgoing side of the backlight module, and the touch substrate is arranged on a side of the backlight module away from the display module; the backlight module includes a backlight source, a diffusion sheet and a light guide plate, the backlight source is arranged on a same side of the diffusion sheet and the light guide plate, the diffusion sheet is arranged between the touch substrate and the display module, and the light guide plate is arranged between the diffusion sheet and the display module.

Optionally, in the display apparatus provided in the embodiments of the present disclosure, the backlight module further includes a reflector between the touch substrate and the diffusion sheet, and the reflector is configured to reflect visible light and transmit non-visible light.

Optionally, in the display apparatus provided in the embodiments of the present disclosure, the display module is an electroluminescent display module.

Optionally, in the display apparatus provided in the embodiments of the present disclosure, the display module includes a plurality of display pixels, and a ratio of an area of one of the display pixels to an area of one of the photosensitive pixels is in a range from 9:1 to 12:1.

In another aspect, embodiments of the present disclosure further provide a display system, including a display apparatus and a non-visible light emitter, and the display apparatus is the display apparatus provided by the embodiments of the present disclosure.

DETAIL DESCRIPTION OF EMBODIMENTS

Figure 1:
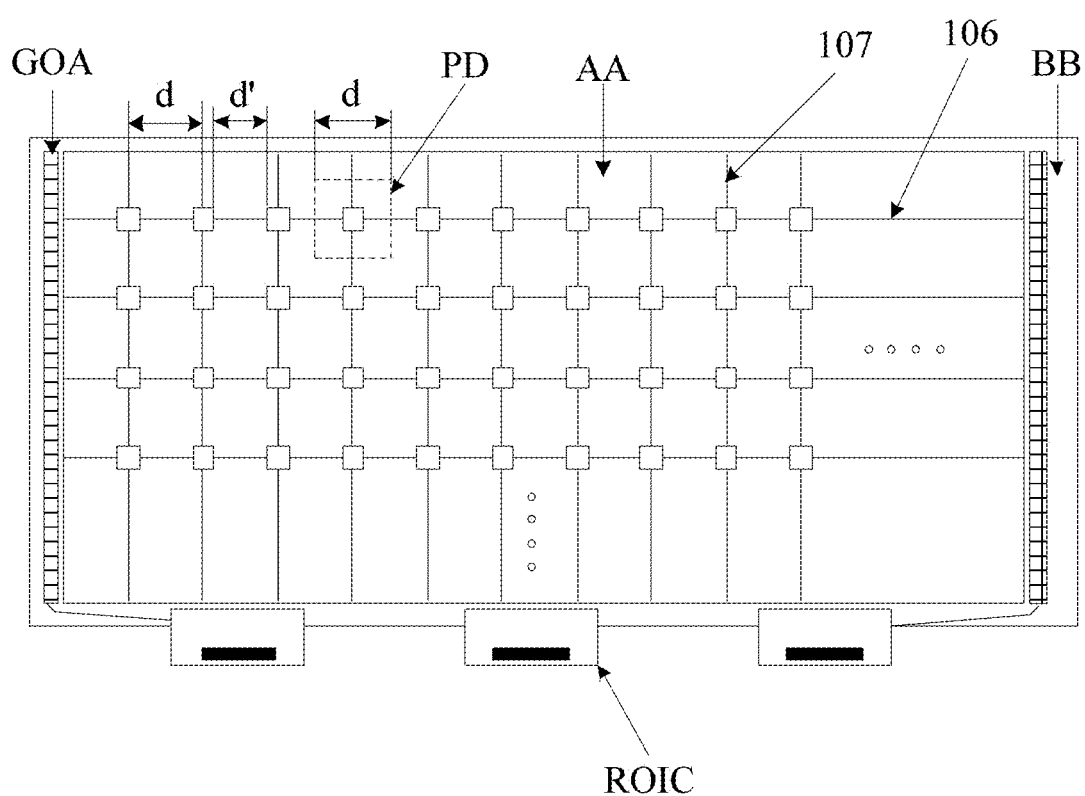
FIG. 1 is a schematic diagram of a structure of a touch substrate according to embodiments of the present disclosure.

To make the objects, technical solutions and advantages of the embodiments of the present disclosure more apparent, the technical solutions of the embodiments of the present disclosure will be clearly and completely described below with reference to the drawings of the embodiments of the present disclosure. It should be noted that the sizes and shapes of various elements shown in the drawings are not necessarily drawn to scale and are merely schematic representations of the present disclosure. Like or similar elements or elements having like or similar functions are denoted by like or similar reference symbols throughout the various figures. It is to be understood that the described embodiments are only a few, not all of, embodiments of the present disclosure. All other embodiments, which can be derived by a person skilled in the art from the embodiments of the present disclosure without any creative effort, are within the protective scope of the present disclosure.

Unless defined otherwise, technical or scientific terms used herein shall have the ordinary meaning as understood by one of ordinary skill in the art to which the present disclosure belongs. The terms "first", "second", and the like used in the description and the claims of the present disclosure are not intended to indicate any order, quantity, or importance, but rather are used for distinguishing one element from another. The term "comprising/comprise", "including/includes", or the like, means that the element or item preceding the term contains the element or item listed after the term and its equivalent, but does not exclude other elements or items. The terms "inner", "outer", "upper/on", "lower/under", "left", "right", and the like are used only for indicating relative positional relationships, and when the absolute position of an object being described is changed, the relative positional relationships may also be changed accordingly.

The remote interaction can be realized by adopting a near infrared light sensor, has a huge application prospect in fields such as the smart screen (such as TV & whiteboard), or Gaming MNT or the like, and has technical characteristics including the accurate positioning in a millimeter level, and a response speed in a millisecond level, and the display flexibility and the like, and realize the soaring accurate non-delay positioning operation and the non-contact handwriting effect.

A longitudinally extending bias line is generally used to provide a bias voltage for a near infrared light sensor, so that the near infrared light sensor operates in a reverse bias state. When the near infrared light irradiates the near infrared light sensor, the near infrared light is converted into a carrier, which in turn is written into an integrated circuit (IC) for further processing, so that a touch position may be determined, and a light touch function is realized. However, as a size of the product increases, a distance between a start end of the bias line and the integrated circuit is greatly different from a distance between a stop end of the bias line and the integrated circuit, so that an impedance difference between the start end and the stop end of the bias line is great, a difference between bias signals transmitted on the bias line at the start end and the stop end of the bias line is increased accordingly. Finally, electrical signals read by the integrated circuit are different from each other due to the difference of the bias signals, which seriously affects the recognition effect of the light touch control.

Figure 2:
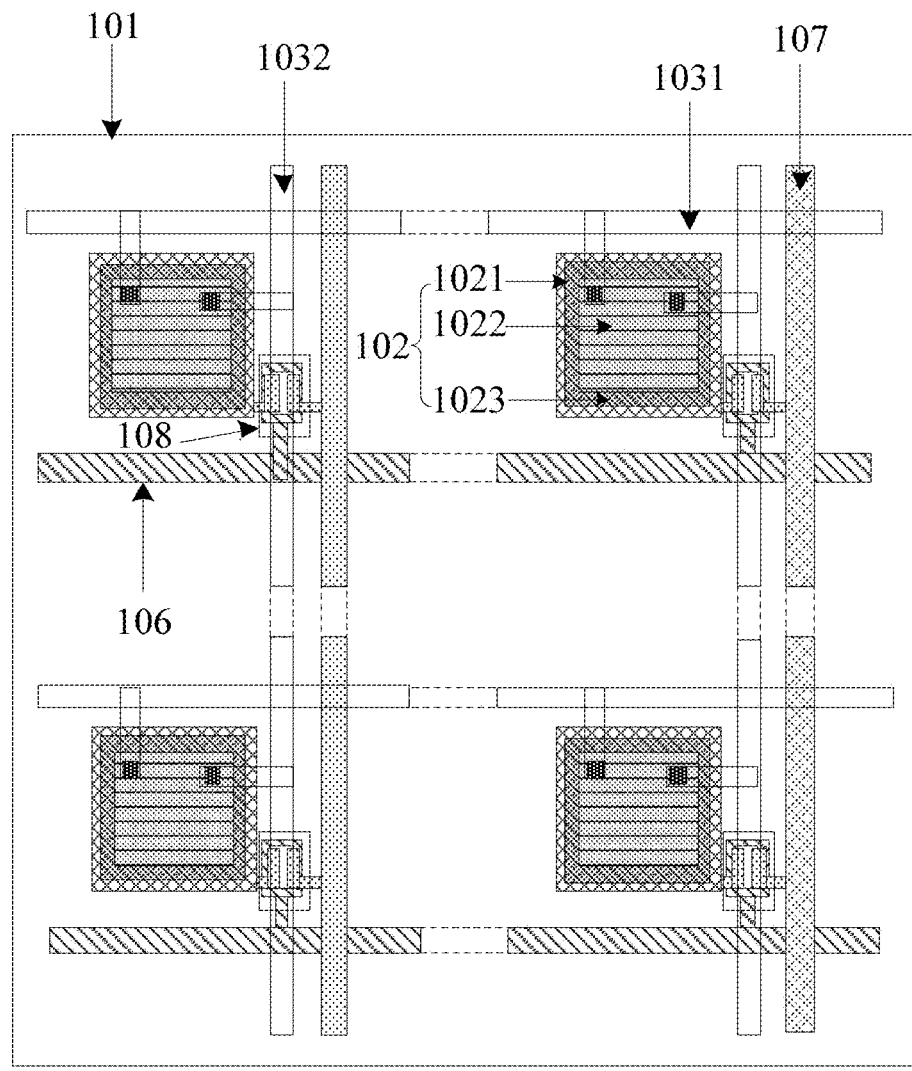
FIG. 2 is a schematic diagram of another structure of a touch substrate according to embodiments of the present disclosure.

In order to at least solve the above technical problems in the related art, embodiments of the present disclosure provide a touch substrate 001, which is particularly suitable for the field of the remote large-sized non-visible light (e.g., near infrared light) interaction technology. As shown in FIG. 1 and FIG. 2, the touch substrate may include:

A base substrate 101 including a photosensitive region AA;

A plurality of photosensitive pixels PD arranged in an array in the photosensitive region AA, where each photosensitive pixel PD may include one non-visible light sensor 102, and a ratio of a side length d of the photosensitive pixel PD (also referred to as a pixel period, or a center-to-center distance between two adjacent photosensitive pixels PD (a distance between centers of two adjacent photosensitive pixels PD)) to a distance d' between the non-visible light sensors 102 of two adjacent photosensitive pixels PD is in a range from 25:24 to 12:11;

A plurality of bias lines 103 on a side of the plurality of non-visible light sensors 102 away from the base substrate 101, wherein the plurality of bias lines 103 may include a plurality of first bias lines 1031 and a plurality of second bias lines 1032 crossing with each other, and at least one of the plurality of first bias lines 1031 and the plurality of second bias lines 1032 is electrically connected to each non-visible light sensor 102 (each non-visible light sensor 102 is electrically connected to at least one of the plurality of first bias lines 1031 and the plurality of second bias lines 1032).

In the touch substrate provided by the embodiments of the present disclosure, the ratio of the side length d of each photosensitive pixel PD to the distance d' between the non-visible light sensors 102 of two adjacent photosensitive pixels PD is in a range from 25:24 to 12:11, so it can be seen that the distance d' between the non-visible light sensors 102 of two adjacent photosensitive pixels PD is greater, and the filling rate of the photosensitive pixels PD does not need to be considered. In other words, the filling rate of the photosensitive pixels PD cannot be affected by a mesh structure formed by the plurality of first bias lines 1031 and the plurality of second bias lines 1032 crossing with each other. Moreover, compared with the bias lines 103 extending in a single direction, the overall impedance of the bias lines 103 having the mesh structure is less, so that the uniformity of the signals read by the non-visible light sensors 102 at a near end and a distal end of the photosensitive region AA can be improved, and the recognition effect of the light touch control can also be improved.

In some embodiments, in the touch substrate provided in the embodiments of the present disclosure, as shown in FIG. 2, each first bias line 1031 may be electrically connected to one row of non-visible light sensors 102, and each second bias line 1032 may be electrically connected to one column of non-visible light sensors 102. Equivalently, each non-visible light sensor 102 is electrically connected to one first bias line 1031 and one second bias line 1032 through two vias, so that the impedance between the non-visible light sensor 102 and the bias line 103 is greatly reduced.

Figure 3:
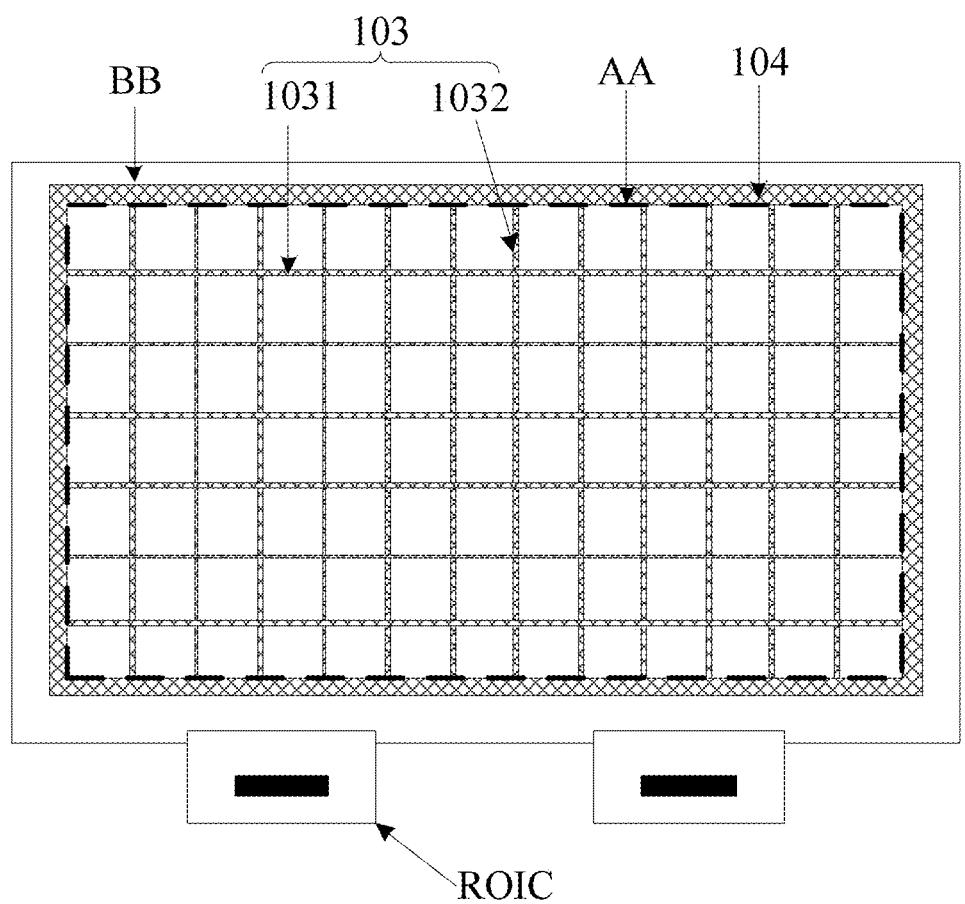
FIG. 3 is a schematic diagram of another structure of a touch substrate according to embodiments of the present disclosure.

In some embodiments, in the touch substrate provided in the embodiments of the present disclosure, as shown in FIG. 3, the base substrate 101 may further include a non-photosensitive region BB around the photosensitive region AA;

The touch substrate may further include: a closed-loop trace 104 arranged in the non-photosensitive region BB and electrically connected to at least a part of the plurality of bias lines 103, and a line width of the closed-loop trace 104 is greater than that of each bias line 103.

The closed-loop trace 104 is arranged to facilitate loading the bias lines 103 with a bias voltage. The closed-loop trace 104 has a large line width and a small impedance, and the closed-loop trace 104 electrically connected to the bias lines 103 is equivalent to providing a small resistor connected in parallel to the bias lines 103, thereby greatly reducing the impedance of the transmission path for the bias voltage.

In some embodiments, in the touch substrate provided in the embodiments of the present disclosure, in order to ensure that the impedance of the transmission path for the bias voltage is small, the line width of each bias line 103 may be in a range from 8 μm to 15 μm, and the line width of the closed-loop trace 104 may be in a range from 200 μm to 500 μm.

Figure 4:
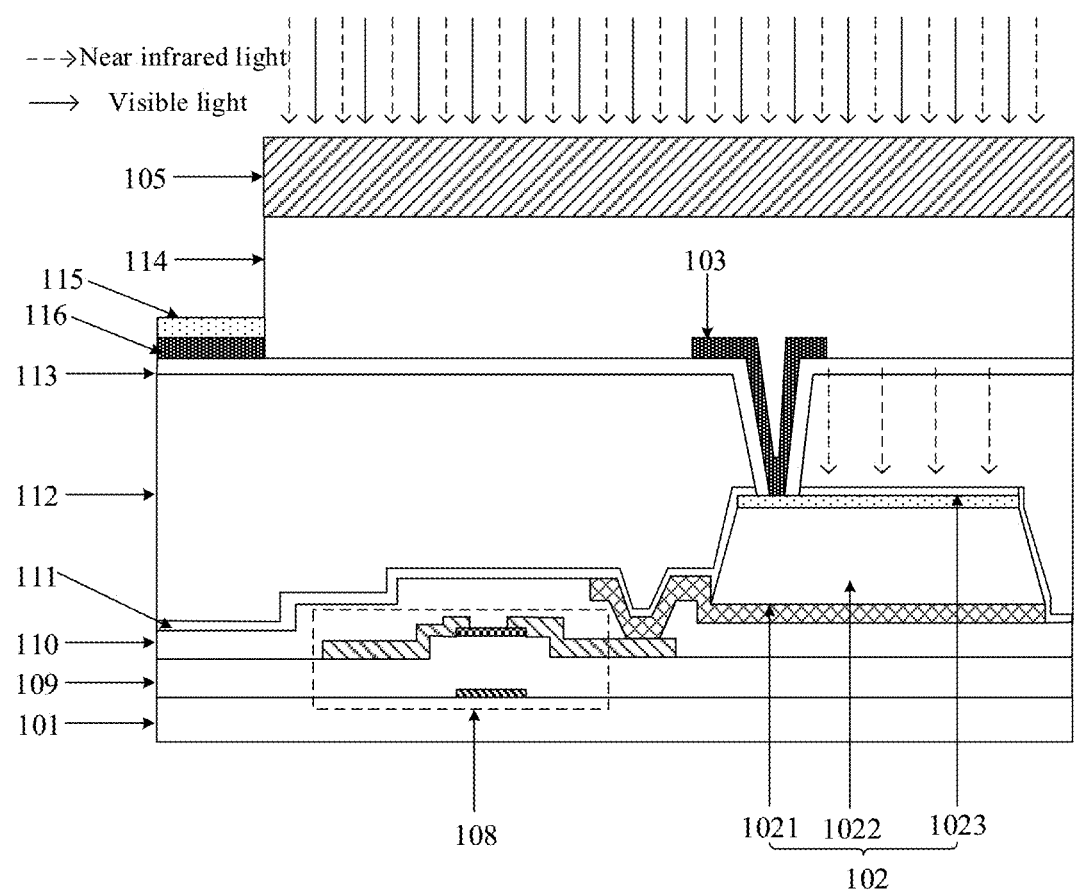
FIG. 4 is a schematic cross-sectional view of a structure of a photosensitive pixel according to embodiments of the present disclosure.

In some embodiments, in the touch substrate provided in the embodiments of the present disclosure, as shown in FIG. 4, the closed-loop trace 104 may be made of the same material and in the same layer as the bias lines 103, so that the closed-loop trace 104 is avoided to be separately manufactured through a mask process, and thus the number of layers can be reduced, the cost can be saved, and the generation efficiency can be improved.

In some embodiments, in the touch substrate provided in the embodiments of the present disclosure, the bias lines 103 may be made of a material with good conductivity and low resistance, such as a metal element and/or an alloy.

A near infrared light emitter emits near infrared light with a wavelength in a range from 800 nm to 900 nm, a size of a light spot is limited to be less than or equal to 5 mm, and the divergence of the light spot is not more than 5% at a distance less than or equal to 5 m. A transmitting distance and a receiving distance are each limited to be in a range of 0 m to 10 m from the screen. If each distance is too great, there is little significance according to the use scene. A transmitting power of the near infrared light emitter is limited to be less than or equal to 1 mw, so that the household injury prevention requirement (it is reported that the near infrared light with a high intensity can injure the iris of the eyes of a person) is met, and a signal intensity of a receiving end can be met. The non-visible near infrared light emitted in this way is projected on the display apparatus, and a large light spot necessarily (completely) covers the non-visible light sensors 102, so that the conversion of an optical signal to an electrical signal can be realized by the non-visible light sensors 102.

Based on this, in the touch substrate provided in the embodiments of the present disclosure, as shown in FIG. 1, the side length d of each photosensitive pixel PD may be in a range from 3 mm to 5 mm, to match a light spot size of the non-visible light emitter (e.g., a near infrared light emitter).

In some embodiments, as shown in FIG. 1, a bisector of the center-to-center distance between two adjacent photosensitive pixels PD is a boundary of each photosensitive pixel PD (i.e., the side length d of each photosensitive pixel PD is equal to the center-to-center distance between the two adjacent photosensitive pixels PD), so that an area of each photosensitive pixel PD may be equal to a square of the center-to-center distance between the two adjacent photosensitive pixels PD. For example, the center-to-center distance between the two adjacent photosensitive pixels PD is in a range of the side length d of each photosensitive pixel PD, that is, in a range from 3 mm to 5 mm, and correspondingly, the area of the photosensitive pixel P may be in a range from 3 mm×3 mm to 5 mm×5 mm, that is, 9 mm$^2$ to 25 mm$^2$.

In some embodiments, each non-visible light sensor 102 may be a near infrared sensor, and the near infrared sensor made of the amorphous silicon (a-si) material is sensitive to both the near infrared light band and the visible light band, and have a strong absorption for the light in the near infrared light band and the visible light band. Therefore, in the display apparatus provided in the embodiments of the present disclosure, in order to prevent the ambient light from interfering the light touch effect and prevent the non-visible light sensors 102 from being overexposed due to receiving the ambient light, as shown in FIG. 4, the touch substrate provided in the embodiments of the present disclosure may further include: a non-visible light antireflection film 105 located on a side of the non-visible light sensors 102 away from the base substrate 101, and the non-visible light antireflection film 105 may selectively transmit the non-visible light (e.g., the near infrared light). For ease of manufacturing, the non-visible light antireflection film 105 may completely cover the photosensitive region AA. In some embodiments, a material of the non-visible light antireflection film 105 may be a black matrix (BM) material, which can selectively transmit the non-visible light (e.g., the near infrared light) and block the non-visible light in other bands (e.g., a non-near infrared band) and the visible light.

Figure 5:
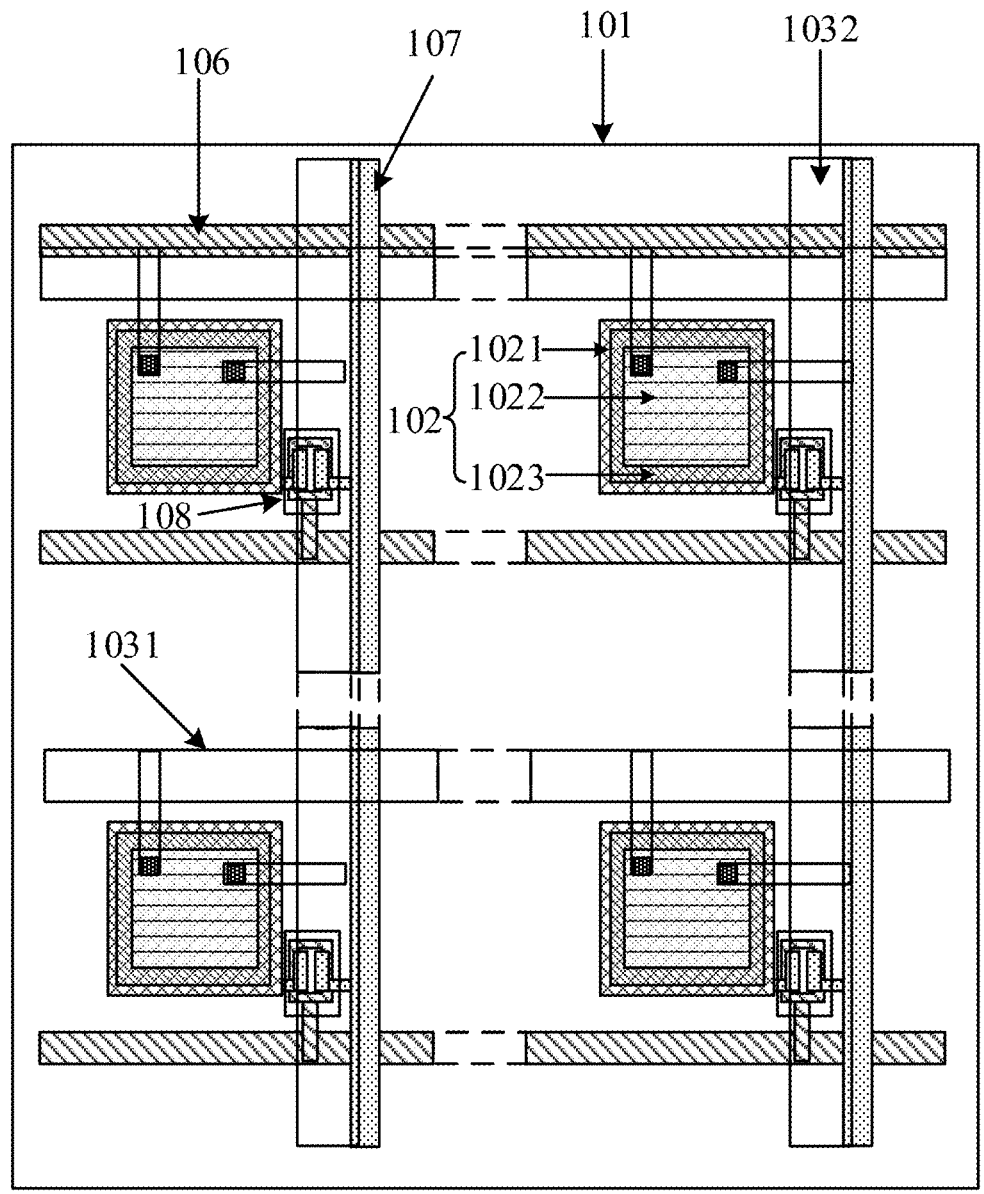
FIG. 5 is a schematic diagram of another structure of a touch substrate according to embodiments of the present disclosure.
Figure 6:
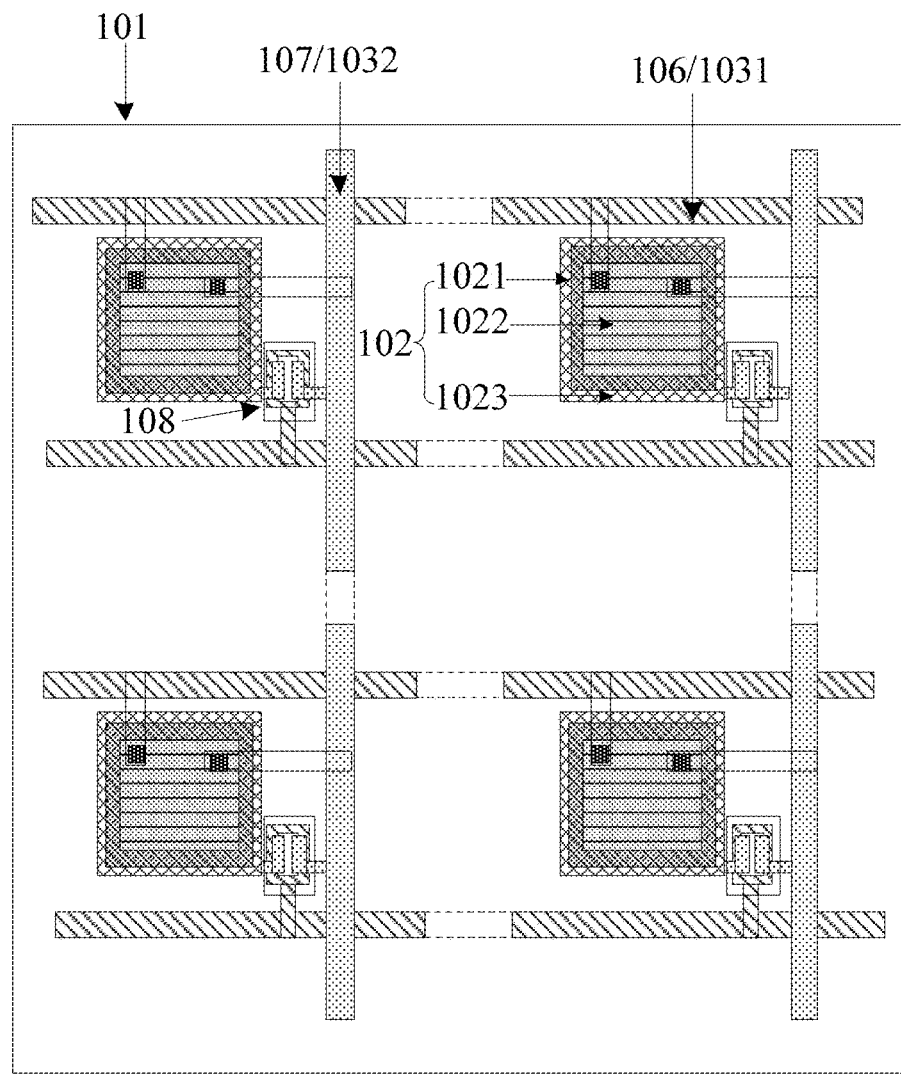
FIG. 6 is a schematic diagram of another structure of a touch substrate according to embodiments of the present disclosure.

In some embodiments, as shown in FIG. 2, FIG. 5 and FIG. 6, the touch substrate provided in the embodiments of the present disclosure may further include: a plurality of gate lines 106 and a plurality of data lines 107, and the gate lines 106 have a same extending direction as the first bias lines 1031, and the data lines 107 have a same extending direction as the second bias lines 1032.

An orthographic projection of the gate lines 106 on the base substrate 101 and an orthographic projection of the first bias lines 1031 on the base substrate 101 may not overlap with each other or at least partially overlap with each other.

An orthographic projection of the data lines 107 on the base substrate 101 and an orthographic projection of the second bias lines 1032 on the base substrate 101 may not overlap with each other or at least partially overlap with each other.

Since the center-to-center distance d of each photosensitive pixel PD is sufficiently large, there is sufficient space for arranging the gate lines 106, the data lines 107, and the bias lines 103. On this basis, the orthographic projections of the first bias lines 1031 and the gate lines 106 extending in the same direction on the base substrate 101 may not overlap with each other (as shown in FIG. 2), or may partially overlap with each other (as shown in FIG. 5) or completely overlap with each other (as shown in FIG. 6); similarly, the orthographic projections of the second bias lines 1032 and the data lines 107 extending in the same direction on the base substrate 101 may not overlap with each other (as shown in FIG. 2), may partially overlap with each other (as shown in FIG. 5) or may completely overlap with each other (as shown in FIG. 6). Since the first bias lines 1031 and the second bias lines 1032 are loaded with bias voltages at fixed potentials, the bias lines 103 do not interfere with signals on the gate lines 106 and the data lines 107 even if the first bias lines 1031 overlap with the gate lines 106 and the second bias lines 1032 overlap with the data lines 107.

In some embodiments, in the touch substrate provided in the embodiments of the present disclosure, as shown in FIG. 4, each non-visible light sensor 102 may include a first electrode 1021, a photosensitive layer 1022, and a second electrode 1023 which are stacked, where the first electrode 1021 is located between the base substrate 101 and the photosensitive layer 1022, and in a direct contact with the photosensitive layer 1022; the second electrode 1023 is electrically connected to the corresponding first bias line 1031 and the corresponding second bias line 1032, and in a direct contact with the photosensitive layer 1022. By separately arranging the first electrode 1021 in a direct contact with the photosensitive layer 1022, the first electrode 1021 can be ensured to be flat, and leakage current can be reduced.

In some embodiments, in the touch substrate provided in the embodiments of the present disclosure, the photosensitive layer 1022 may include a P-type amorphous silicon semiconductor layer, an intrinsic amorphous silicon semiconductor layer, and an N-type amorphous silicon semiconductor layer which are stacked sequentially, and the P-type amorphous silicon semiconductor layer is in a direct contact with the second electrode 1023, and the N-type amorphous silicon semiconductor layer is in a direct contact with the first electrode 1021.

In some embodiments, in the touch substrate provided in the embodiments of the present disclosure, a ratio of an area of the photosensitive layer 1022 of each non-visible light sensor 102 to the area of each photosensitive pixel PD is in a range from 0.0004 to 0.0036, so that a filling ratio of the photosensitive pixel PD is larger, which is beneficial to improving the sensitivity of the light touch control. In some embodiments, the area of each photosensitive pixel PD may be in a range from 9 mm$^2$ to 25 mm$^2$, and the area of the photosensitive layer 1022 of each non-visible light sensor 102 may be in a range from 2000 μm$^2$ to 2500 μm$^2$.

In some embodiments, in the touch substrate provided in the embodiments of the present disclosure, as shown in FIGS. 2 and 4, each photosensitive pixel PD may further include a transistor 108, a gate electrode of the transistor 108 is electrically connected to the corresponding gate line 106, a first electrode of the transistor 108 is electrically connected to the corresponding data line 107, and a second electrode of the transistor 108 is electrically connected to the corresponding first electrode 1021; the gate electrode of the transistor 108 is made of the same material as the gate line 106 and is located in the same layer as the gate line 106; the data line 107, the first electrode and the second electrode of the transistor 108 are made of the same material and located in the same layer; and the data line 107 is located between a layer where the gate line 106 is located and a layer where the first electrode 1021 is located. Thus, the transistor 108 may be controlled by the corresponding gate line 106 to be turned on or off, and a photocurrent read by the transistor 108 may be written into the integrated circuit through the corresponding data line 107.

In some embodiments, in the touch substrate provided by the embodiments of the present disclosure, as shown in FIG. 2, an orthographic projection of a channel region of the transistor 108 on the base substrate 101 is located within an orthographic projection of the corresponding second bias line 1032 on the base substrate 101, so that the channel region of the transistor 108 is shielded by the second bias line 1032 to avoid the influence of light on the channel region of the transistor 108.

In some embodiments, in the touch substrate provided in the embodiments of the present disclosure, as shown in FIG. 1, the touch substrate may further include: gate driving circuits GOA for providing scanning signals to the plurality of gate lines 106, and read circuits ROIC electrically connected to the plurality of data lines 107; the gate driving circuits GOA are located on a left frame and a right frame, and a width of each gate driving circuit GOA is in a range from 1 mm to 2 mm; the number of the read circuits ROIC increases as the size of the product increases.

In some embodiments, as shown in FIG. 4, the touch substrate provided in the embodiments of the present disclosure may further include: a gate insulating layer 109, a first insulating layer 110, a first protective layer 111, a planarization layer 112, a second insulating layer 113, a second protective layer 114, an indium tin oxide layer 115, and a bias terminal (Pad) 116, and the indium tin oxide layer 115 can protect the bias terminal 116 from corrosion by water, oxygen, and the like in the air. Other essential components in the touch substrate should be understood by one of ordinary skill in the art and therefore, are not described herein and should not be construed as a limitation to the present disclosure.

Figure 7:
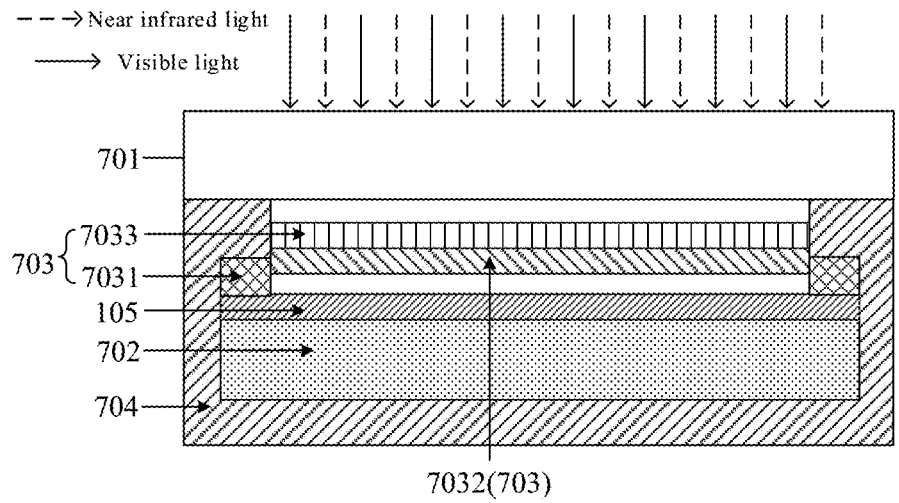
FIG. 7 is a schematic diagram of a structure of a display apparatus according to embodiments of the present disclosure.

In another aspect, embodiments of the present disclosure further provide a display apparatus, as shown in FIG. 7, including a display module 701 and a touch substrate 702, where the touch substrate 702 is the touch substrate 702 provided in the embodiments of the present disclosure, and the touch substrate 702 is located on a side opposite to a display surface of the display module 701. As the principle of the display apparatus for solving the problems is similar to that of the touch substrate, the implementation of the display apparatus provided by the embodiments of the present disclosure can refer to the implementation of the touch substrate provided by the embodiments of the present disclosure, and repeated descriptions are omitted.

In some embodiments, in the display apparatus provided in the embodiments of the present disclosure, the display module 701 may be a twisted nematic (TN) type liquid crystal display, an advanced dimension switch (ADS) type liquid crystal display, a high-advanced dimension switch (HADS) type liquid crystal display, an in-plane switch (IPS) type liquid crystal display, or the like, which is not particularly limited herein. Other essential components in the liquid crystal display module should be understood by one of ordinary skill in the art and therefore, are not described herein, and should not be construed as a limitation to the present disclosure.

In some embodiments, as shown in FIG. 7, the display apparatus provided in the embodiments of the present disclosure may further include a backlight module 703.

The display module 701 is located on a light outgoing side of the backlight module 703, and the touch substrate 702 is located on a side of the backlight module 703 away from the display module 701.

The backlight module 703 may include a backlight source 7031, a diffusion sheet 7032, and a light guide plate 7033, the backlight source 7031 may be located on a same side of the diffusion sheet 7032 and the light guide plate 7033, the diffusion sheet 7032 may be located between the touch substrate 702 and the display module 701, and the light guide plate 7033 may be located between the diffusion sheet 7032 and the display module 701. The light emitted from the backlight source 7031 enters the diffusion sheet 7032 and the light guide plate 7033 through the same side of the diffusion sheet 7032 and the light guide plate 7033, and can be uniformly incident on the liquid crystal display module due to combination of the diffusion sheet 7032 and the light guide plate 7033.

Figure 8:
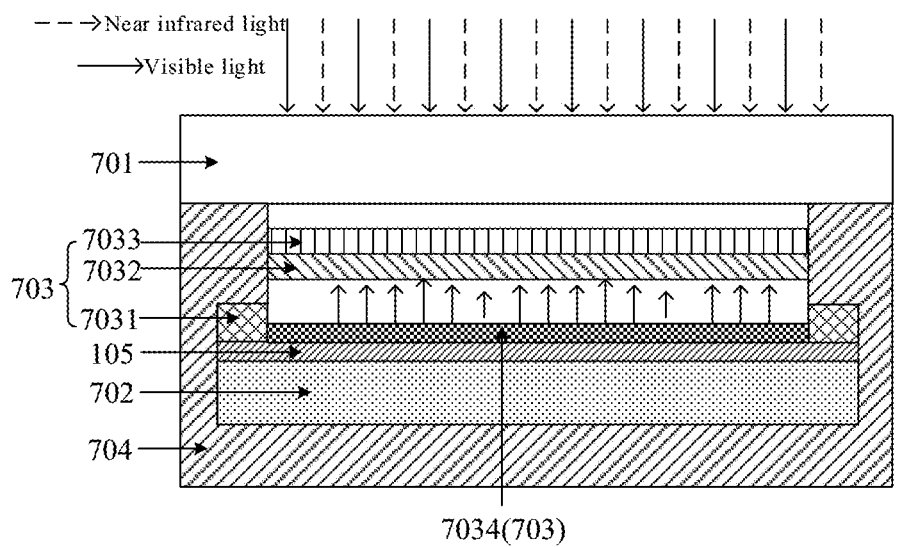
FIG. 8 is a schematic diagram of a structure of a display apparatus according to embodiments of the present disclosure.

In some embodiments, in the display apparatus provided in the embodiments of the present disclosure, as shown in FIG. 8, the backlight module 703 may further include a reflector 7034 located between the touch substrate 702 and the diffusion sheet 7032. In order to prevent the detection of the non-visible light (e.g., the near infrared light) by the non-visible light sensors 102 from being affected, the reflector 7034 may be configured to reflect the visible light and transmit the non-visible light (e.g., the near infrared light).

Figure 9:
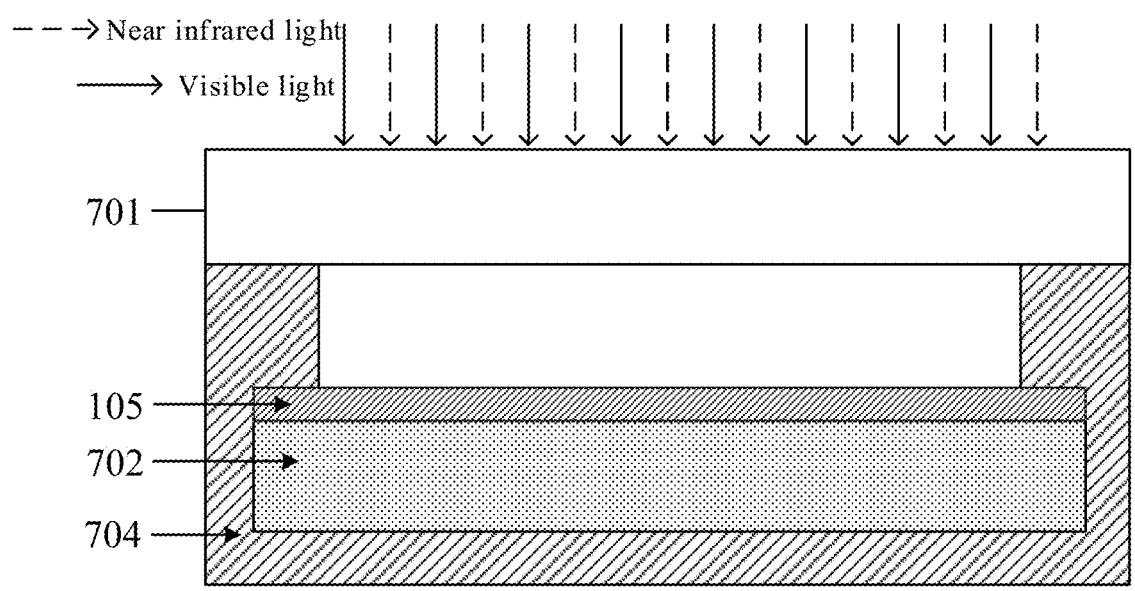
FIG. 9 is a schematic diagram of a structure of a display apparatus according to embodiments of the present disclosure.

In some embodiments, as shown in FIG. 9, in the display apparatus provided in the embodiments of the present disclosure, the display module 701 may be an electroluminescence display module, such as an organic light emitting diode display module (OLED), a quantum dot light emitting display module (QLED), a mini/micro light emitting display module (mini/micro LED), or the like. Components essential to the electroluminescence display module should be understood by one of ordinary skill in the art to be existing and thus, are not described herein, and should not be construed as a limitation to the present disclosure.

Figure 10:
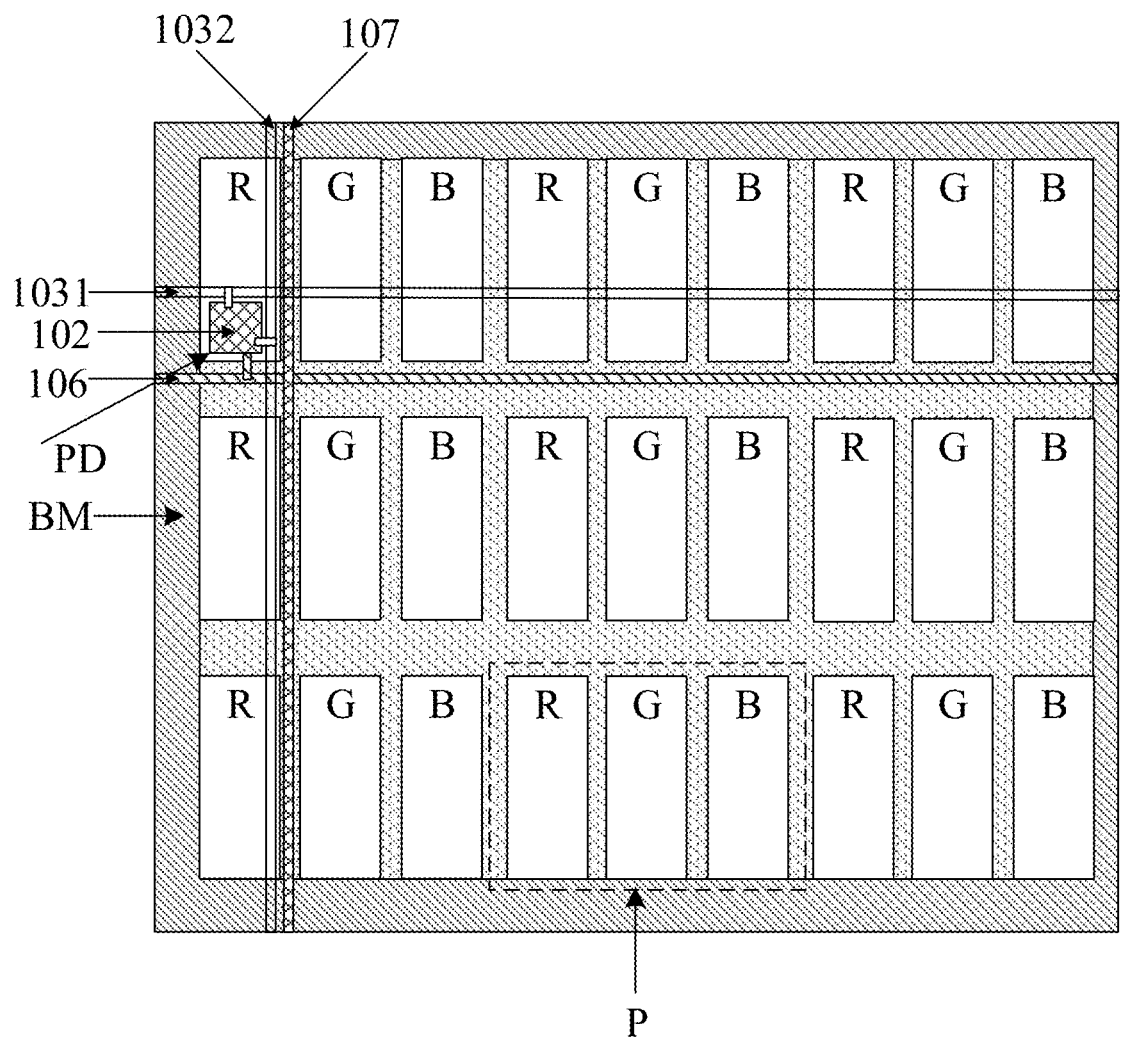
FIG. 10 is a schematic diagram illustrating how to match sizes of a photosensitive pixel and a display pixel.

The photosensitive pixels PD are located below the backlight module 703, which does not affect the backlight uniformity, so that the larger photosensitive pixels PD may be arranged, to ensure that the photosensitive pixels PD have sufficient photosensitive areas. Therefore, in the display apparatus provided by the embodiments of the present disclosure, as shown in FIG. 10, the display module 701 may include a plurality of display pixels P, and a ratio of an area of each display pixel P to the area of each photosensitive pixel PD may be in a range from 9:1 to 12:1, that is, the area of each display pixel P may be equal to a sum of the areas of 9 to 12 photosensitive pixel PD. In some embodiments, each display pixel P may include a red sub-pixel R, a green sub-pixel G, a blue sub-pixel B, and the like, which are not limited herein.

In some embodiments, as shown in FIGS. 7 to 9, the display apparatus provided in the embodiments of the present disclosure may further include a support frame 704 for protecting and supporting the display module 701, the touch substrate 702, the backlight module 703, and the like. Other essential components in the display apparatus should be understood by one of ordinary skill in the art and therefore, are not described herein, and should not be construed as a limitation to the present disclosure.

Figure 11:
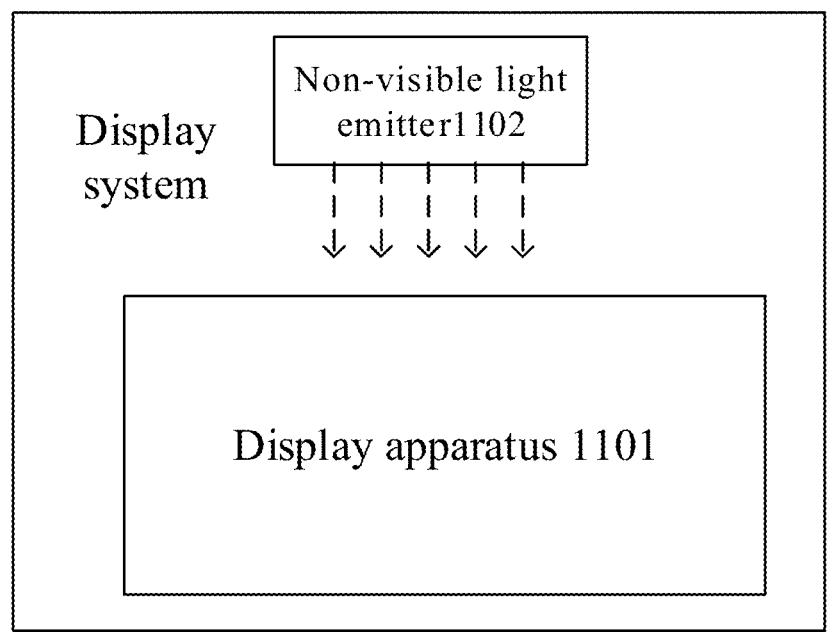
FIG. 11 is a schematic diagram of a structure of a display system according to embodiments of the present disclosure.

Based on the same inventive concept, the embodiments of the present disclosure further provide a display system, as shown in FIG. 11, which may include a display apparatus 1101 and a non-visible light emitter 1102, where the display apparatus 1101 is the above display apparatus provided by the embodiments of the present disclosure. Because the principle of the display system for solving the problems is similar to that of the display apparatus, the implementation of the display system provided by the embodiments of the present disclosure can refer to the implementation of the display apparatus provided by the embodiments of the present disclosure, and repeated descriptions are omitted.

In a specific implementation, the non-visible light emitted by the non-visible light emitter 1102 is projected on the display apparatus 1101, and a large light spot covers the non-visible sensors 102, so that an optical signal can be converted into an electrical signal by the non-visible sensors 102, and a touch position is determined by processing the electrical signal, thereby realizing the remote touch interaction.

It will be apparent to one of ordinary skill in the art that, various changes and modifications may be made in the embodiments of the present disclosure without departing from the spirit and scope of the present disclosure. Thus, if such changes and modifications of the embodiments of the present disclosure are within the scope of the claims and their equivalents of the present disclosure, the present disclosure is also intended to encompass such changes and modifications.

What is claimed is:

1. A touch substrate, comprising:
   a base substrate comprising a photosensitive region;
   a plurality of photosensitive pixels in an array in the photosensitive region, wherein each photosensitive pixel comprises one non-visible light sensor, and a ratio of a side length of each photosensitive pixel to a distance between the non-visible light sensors of two adjacent photosensitive pixels is in a range from 25:24 to 12:11; and
   a plurality of bias lines on a side of the non-visible light sensors away from the base substrate, wherein the plurality of bias lines comprise a plurality of first bias lines and a plurality of second bias lines crossing with each other, and each non-visible light sensor is electrically connected to at least one of the plurality of first bias lines and the plurality of second bias lines.

2. The touch substrate of claim 1, wherein each first bias line is electrically connected to one row of non-visible light sensors, and each second bias line is electrically connected to one column of non-visible light sensors.

3. The touch substrate of claim 1, wherein the base substrate further comprises a non-photosensitive region around the photosensitive region; and
   the touch substrate further comprises a closed-loop trace in the non-photosensitive region and electrically connected to at least a part of the plurality of bias lines, and a line width of the closed-loop trace is greater than that of each bias line.

4. The touch substrate of claim 3, wherein the closed-loop trace and the plurality of bias lines are in a same layer and made of a same material.

5. The touch substrate of claim 4, wherein the plurality of bias lines are made of a metal element or an alloy.

6. The touch substrate of claim 1, further comprising a non-visible light antireflection film on a side of the non-visible light sensors away from the base substrate, and completely covering the photosensitive region.

7. The touch substrate of claim 6, wherein the non-visible light antireflection film is made of a black matrix material, and the black matrix material selectively transmits non-visible light.

8. The touch substrate of claim 1, further comprising a plurality of gate lines and a plurality of data lines;
   wherein an extending direction of each gate line is identical to that of each first bias line, and an extending direction of each data line is identical to that of each second bias line;
   an orthographic projection of the plurality of gate lines on the base substrate and an orthographic projection of the plurality of first bias lines on the base substrate do not overlap with each other or at least partially overlap with each other; and
   an orthographic projection of the plurality of data lines on the base substrate and an orthographic projection of the plurality of second bias lines on the base substrate do not overlap with each other or at least partially overlap with each other.

9. The touch substrate of claim 8, wherein each non-visible light sensor comprises a first electrode, a photosensitive layer, and a second electrode which are stacked sequentially, and
   the first electrode is between the base substrate and the photosensitive layer and in a direct contact with the photosensitive layer; the second electrode is electrically connected to a corresponding first bias line and a corresponding second bias line, and in a direct contact with the photosensitive layer.

10. The touch substrate of claim 9, wherein the photosensitive layer comprises a P-type amorphous silicon semiconductor layer, an intrinsic amorphous silicon semiconductor layer, and an N-type amorphous silicon semiconductor layer which are stacked sequentially, and
    the P-type amorphous silicon semiconductor layer is in a direct contact with the second electrode, and the N-type amorphous silicon semiconductor layer is in a direct contact with the first electrode.

11. The touch substrate of claim 9, wherein a ratio of an area of the photosensitive layer of each non-visible light sensor to an area of each photosensitive pixel is in a range from 0.0004 to 0.0036.

12. The touch substrate of claim 9, wherein each photosensitive pixel further comprises a transistor, a gate electrode of the transistor is electrically connected to a corresponding gate line, a first electrode of the transistor is electrically connected to a corresponding data line, and a second electrode of the transistor is electrically connected to a corresponding first electrode; and
    the gate electrode of the transistor is made of a same material as the gate line and is located in a same layer as the gate line; the data line, the first electrode and the second electrode of the transistor are made of a same material and located in a same layer; and the data line is between a layer where the gate line is located and a layer where the first electrode is located.

13. The touch substrate of claim 9, wherein an orthographic projection of a channel region of the transistor on the base substrate is within an orthographic projection of a corresponding second bias line on the base substrate.

14. A display apparatus, comprising a display module and a touch substrate, wherein the touch substrate is the touch substrate of claim 1, and the touch substrate is on a side of the display module away from a display surface of the display module.

15. The display apparatus of claim 14, further comprising a backlight source;
 wherein the display module is a liquid crystal display module on a light outgoing side of the backlight source.

16. The display apparatus of claim 15, further comprising a diffusion sheet and a light guide plate,
 wherein the diffusion sheet is between the light outgoing side of the backlight source and the display module, and the light guide plate is between the diffusion sheet and the display module.

17. The display apparatus of claim 16, further comprising a reflector between the light outgoing side of the backlight source and the diffusion sheet, and configured to reflect visible light and transmit non-visible light.

18. The display apparatus of claim 14, wherein the display module is an electroluminescent display module.

19. The display apparatus of claim 14, wherein the display module comprises a plurality of display pixels, and a ratio of an area of one of the display pixels to an area of one of the photosensitive pixels is in a range from 9:1 to 12:1.

20. A display system, comprising a display apparatus and a non-visible light emitter,
 wherein the display apparatus is the display apparatus of claim 14.

\* \* \* \* \*